United States Patent
Sundar et al.

(10) Patent No.: US 6,954,914 B2
(45) Date of Patent: Oct. 11, 2005

(54) METHOD AND APPARATUS FOR SIGNAL ELECTROMIGRATION ANALYSIS

(75) Inventors: Shyam Sundar, Sunnyvale, CA (US); Aveek Sarkar, Mountain View, CA (US); Peter F. Lai, San Jose, CA (US); Rambabu Pyapali, Cupertino, CA (US); Teong Ming Cheah, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 79 days.

(21) Appl. No.: 10/395,436

(22) Filed: Mar. 24, 2003

(65) Prior Publication Data

US 2004/0194043 A1 Sep. 30, 2004

(51) Int. Cl.⁷ .............................................. G06F 17/50
(52) U.S. Cl. .................................. 716/5; 716/6; 716/2
(58) Field of Search .................................. 716/1–2, 4–6

(56) References Cited

U.S. PATENT DOCUMENTS

| | | | | |
|---|---|---|---|---|
| 5,831,867 A | * | 11/1998 | Aji et al. ........................ | 716/4 |
| 5,963,729 A | * | 10/1999 | Aji et al. ........................ | 716/5 |
| 6,072,945 A | * | 6/2000 | Aji et al. ........................ | 716/5 |
| 6,728,942 B2 | * | 4/2004 | Lampaert et al. ............. | 716/10 |
| 6,766,498 B2 | * | 7/2004 | Sharma et al. ................ | 716/5 |

OTHER PUBLICATIONS

Doughty, Francis M., "The Problem: VLSI metal interconnect 'wears out' due to electromigration," Jun. 16, 1997, http://www-mtl.mit.edu/CAPAM/memos/96-8/node2.html, accessed Aug. 7, 2002, 2 pages.

"Electromigration," Dept. of Materials Science and Metallurgy, University of Cambridge, http://www.msm.cam.ac.uk/mkg/e_mig.html, accessed Aug. 7, 2002, 1 page.

"What is Electromigration?" Computer Simulation Laboratory, Nov. 1, 2001, http://www.csl.mete.metu.edu.tr/Electromigration/emig.htm, accessed Aug. 7, 2002, 5 pages.

"EDA Tools," Cadence Design Systems presentation prior to Mar., 2002, 44 pages.

* cited by examiner

*Primary Examiner*—Vuthe Siek
(74) *Attorney, Agent, or Firm*—Zagorin O'Brien Graham LLP

(57) ABSTRACT

The present application describes various embodiments of a method and an apparatus for determining electromigration risks for signal nets in integrated circuits. A model for each one of the global nets connecting various circuit blocks in an integrated circuit is created using circuit blocks' timing model and detailed standard parasitic format representation (DSPF) of each global net. The final layout of the integrated circuit is not necessary to determine the electromigration risks. The models can be generated during the early stages of the design cycle once the DSPF of the global nets is available.

20 Claims, 3 Drawing Sheets

METHOD AND APPARATUS FOR SIGNAL ELECTROMIGRATION ANALYSIS

BACKGROUND

1. Field of the Invention

Present invention relates to electromigration analysis and specifically to electromigration analysis of signal nets in an integrated circuit.

2. Description of the Related Art

Generally, integrated circuit designs are becoming more complex and denser. More devices are compressed in the integrated circuits to improve the performance; however, the currents in these devices typically remain comparable despite increasing miniaturization of the integrated circuits. With higher current density, integrated circuits become more susceptible to electromigration causing the circuits to fail.

Modern integrated circuits typically include a dense array of narrow metallic conductors that carry current between various devices on the chip. At high current densities the electron momentum is transferred to the atoms in these thin film metallic conductors (e.g. signal nets) causing a net atomic flux. The atomic flux leads to voids which can cause a circuit to break open or hillocks, e.g., accumulation of metal leading to shorts with adjacent metal lines (signal nets). These and other effects are generally referred to as electromigration. During the circuit design, it is important to determine the electromigration risk of signal nets in the integrated circuit.

Various tools are available to estimate the current density and electromigration risk of signal nets in the integrated circuits. However, these tools typically require final layout of the integrated circuit and that the layout be free of power and ground shorts. Typically, the clean final layout is not available until the later part of the design cycle. Thus, it becomes difficult to make appropriate adjustment in the design without adding considerable amount of delays (in some cases, months) to the design cycle. Further, the accuracy calculated by these tools is typically within 20% of the actual current density. This leads to inaccurate design of current density for signal nets. A method and apparatus is needed to accurately determine the current density and electromigration risks of signal nets in the integrated circuit earlier in the design cycle.

SUMMARY

The present application describes various techniques for determining current density and electromigration risks of signal nets in an integrated circuit. In some embodiments, a model is created for each one of the global nets connecting various circuit blocks in an integrated circuit. In some variations, the model is created by using a circuit block's timing model and detailed standard parasitic format representation (DSPF) (e.g., resistance, capacitance and other related information or the like) of each global net. In some embodiments, the timing models are created according to the block designs. In some embodiments, the final layout of the integrated circuit is not necessary to determine the electromigration risk.

In some embodiments, the models can be used during the early stages of the design cycle after the DSPF of the global nets is available which provides faster feedback for design engineers to fix global nets susceptible to electromigration. In some variations, the model can simulate the driving strengths and input capacitances at each end of the global net and accurately determine the maximum current density for the global nets. In some embodiments, the current density for each global net can be verified against predetermined current density established by the chip manufacturers.

In some embodiments, the present invention describes a method for use in a design of an integrated circuit. The method includes, prior to preparation of a layout of the integrated circuit design, determining detailed parasitic formats of nets in the integrated circuit design, substituting, in the integrated circuit design, interface elements coupled at ends of the nets with corresponding driving devices having substantially similar characteristics as the interface elements and performing electromigration analysis on the nets. In some variations, the detailed parasitic format represents physical characteristics of the nets, In some embodiments, the physical characteristics include one or more of a resistance, a capacitance, an impedance and a metal type. In some variations, the characteristics of the interface elements include one or more of current drive and input capacitance.

In some embodiments, the interface elements represent one or more of an output interface and input interface of respective circuit blocks that include the interface elements in the integrated circuit design. In some variations, the method includes generating a timing model for each one of the circuit blocks in the integrated circuit, determining current drive of output interfaces of each circuit block, and determining input capacitance of input interfaces of each circuit block. In some variations, the driving devices include one or more of an inverter and a buffer. In some embodiments, the nets are global signal nets. In some embodiments, the method includes simulating current flow on the nets using current drive of the driving devices coupled at the ends of respective nets, and determining whether the current on the nets exceeds respective predetermined current limits for each net. In some variations, the electromigration analysis is performed on subnets of the nets.

In some embodiments, the present invention describes, a circuit analysis tool that performs electromigration analysis on signal nets coupling a plurality of circuit blocks in an integrated circuit design prior to preparation of a layout of the integrated circuit design, by substituting interface elements coupled at ends of the signal nets with corresponding driving devices having substantially similar characteristics as the interface elements. In some variations, the characteristics of the interface elements include one or more of current drive and input, capacitance. In some embodiments, the interface elements represent one or more of an output interface and input interface of respective circuit blocks that include the interface elements in the integrated circuit design. In some variations, the driving devices include one or more of an inverter and a buffer. In some embodiments, the electromigration analysis is performed on the subnets of the nets.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
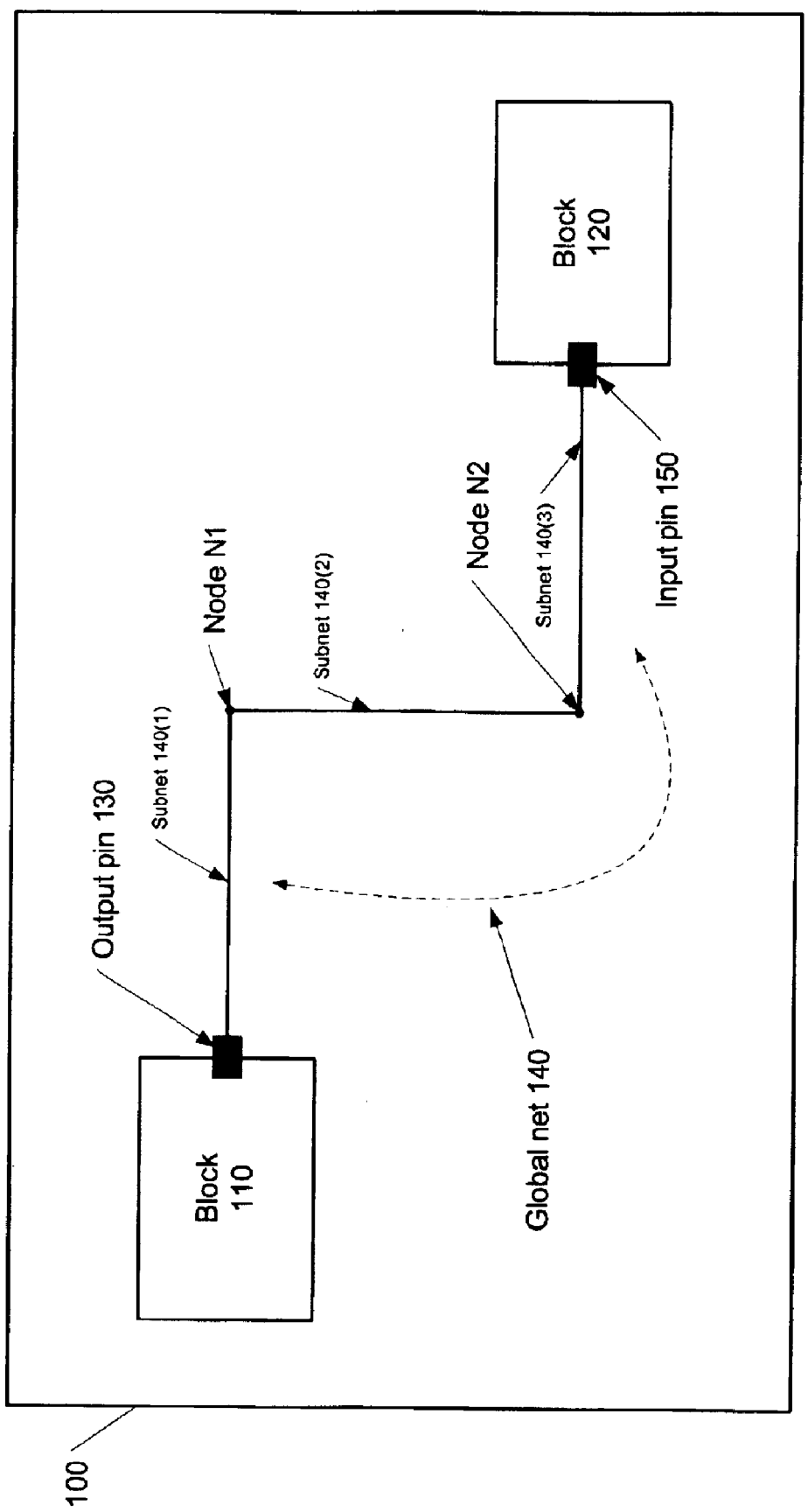
FIG. 1A illustrates an example of a typical integrated circuit design according to an embodiment of the present invention.

FIG. 1A illustrates an example of a typical integrated circuit design according to an embodiment of the present invention. Integrated circuit 100 includes two circuit blocks, block 110 and block 120. Block 110 is coupled to block 120 at an output pin 130 via a global net 140. Global net 140 is coupled to block 120 at an input (receiver) pin 150 of block 120. Global net 140 includes three subnets 140(1)–(3). Subnet 140(1) couples to subnet 140(2) at node N1 and subnet 140(2) couples to subnet 140(3) at node N2. While for purposes of illustration, in the present example, two blocks with one pin each are shown, one skilled in the art will appreciate that integrated circuit 100 can include more than two blocks with more than one pin coupled with more than one global nets net. Similarly, global net 140 can include zero or more subnets and may branch into more blocks like block 120.

In the present example, output pin 130 drives global net 140. Global net 140 can accommodate certain current strength as determined by the manufacturer of integrated circuit 100. The current strength of global net 140 can depend upon various factors (e.g., the type of metal used, physical characteristics or the like). When block 110 drives more current on global net 140 than what global net 140 can handle, global net 140 can lose physical strength due to electromigration and can break the circuit between blocks 110 and 120 or short to an adjacent net, causing functional problems. Thus, it is generally important that block 110 does not drive more current on global net 140 than what global net 140 can handle without substantial electromigration.

To prevent or reduce electromigration, either global net 140 needs to be modified (e.g. widened) to accommodate a high current strength or block 110 needs to be designed such that it does not drive current on the output pin 130 in excess of global net 140's strength. Conventionally, the current strength on global net 140 cannot be determined until after the layout of integrated circuit 100 is finalized ensuring that there are no power and ground shorts in the circuits. Typically, the final design layout is not available until the later part of the design cycle. Thus, it becomes difficult to redesign various blocks to fix nets (like global net 140) having electromigration risks. The redesign during the later part of the design cycle can lead to delays extending the design cycle (in some cases months) and can significantly increase the product cost.

According to some embodiments of the present invention, a timing model is generated for each top level block in integrated circuit 100 using modeling tools known in the art (e.g., SPICE, PEARL or the like). Typically the timing models provide drive strength for output pins in each block and input capacitance associated with each input pin in the respective block. For example, a timing model for the circuit shown in FIG. 1A can provide drive strength of output pin 130 and input capacitance for pin 150. Table 1 illustrates an example of information generated by a timing model according to an embodiment of the present invention. While for purposes of illustrations, the drive strength and input capacitance for two pins are shown, the timing model can include information about other pins and other information about each block (e.g., switching activity, current profile, cycle times or the like).

| | |
|---|---|
| DEFDRIVER P130 | RH = 150 Ω RL = 133 Ω |
| INPUT P150 | CAP = 66.00 fF |

Table 1. An example of an output of a timing model according to an embodiment of the present invention.

Where, DEFDRIVER P130 defines the drive strength for pin 130 as pull up strength (RH) of 150 ohms and pull down strength (RL) of 133 ohms. INPUT P150 CAP defines the input capacitance of pin 150 as 66 femto Farad (lF). Similarly, the DSPF information for each global net in the circuit can be generated using various layout extraction tools (e.g., Simplex or the like) known in the art. The DSPF information generally includes the resistance and capacitance information for each global net. Table 2 illustrates an example of simplified DSPF information generated for global net 140 of FIG. 1. One skilled in the art will appreciate that the layout extraction tools can be programmed to provide additional information regarding a given layout according to the features available in the tool.

TABLE 2

An example of DSPF format for global net 140 shown in FIG. 1

| Element | Characteristic |
|---|---|
| Net | Global-net-140 |
| C1 output-pin-130 | 2 fF |
| C2 N1 | 30 fF |
| C3 N2 | 35 fF |
| C4 input-pin-150 | 50 fF |
| R1 output-pin-130 N1 | 8 Ω |
| METAL output-pin-130 | 1 |
| Length output-pin-130 | 50μ |
| Width output-pin-130 | 1μ |
| R2 N1–N2 | 30 Ω |
| METAL N1–N2 | 1 |
| Length N1–N2 | 50μ |
| Width N1–N2 | 1μ |
| R2 N2 input-pin-150 | 30 Ω |
| METAL N2 input-pin-150 | 1 |
| Length N2 input-pin-150 | 50μ |
| Width N2 input-pin-150 | 1μ |

Where C1 indicates a capacitance of 2 fF at output pin 130, C2 N1 indicates a capacitance of 30 fF at node N1, C3 N2 indicates a capacitance of 35 fF at node 2 and C4 indicates a capacitance of 50 fF at input pin 150. R1 output-pin-130 N1 indicates a resistance of 8Ω between output pin 130 and node N1 (e.g. subnet 140(1)), METAL1 indicates the type of thin metal interconnect and Length and Width indicate the length and width of the metal interconnects (e.g., subnet 140(1)). Similarly, data for subnet 140(2) and 140(3) including the input pin 150 reflects respective characteristics.

An inverter drive strength mapping file for a given circuit and or device technology can be generated or may be available. For example, inverter drive strength can often be generated using the DSPF information generated by simulation tools (e.g., SPICE or the like) known in the art. The inverter drive strength mapping reflects the equivalent drive strength for each element described in Table 2. Table 3 illustrates an example of an inverter drive strength mapping file generated according to an embodiment of the present invention.

TABLE 3

An example of drive strengths of inverters for corresponding widths.

| Inverter Type | PMOS Width ($\mu$) | NMOS Width ($\mu$) | RH ($\Omega$) | RL ($\Omega$) |
|---|---|---|---|---|
| 4x | 5.44 | 2.72 | 803.4 | 708.52 |
| 10x | 13.6 | 6.8 | 321.21 | 284.72 |
| 16x | 21.76 | 10.88 | 201.25 | 177.93 |
| 32x | 43.52 | 21.76 | 100.6 | 88.91 |

Table 3: An example of drive strengths of inverters for corresponding widths.

The inverter type is any arbitrary label assigned to inverters. In the present example, inverter type is indicative of the drive strength. For example, the drive strength of 32× is twice that of 16× and the like. PMOS and NMOS widths are the widths of the p-transistor and n-transistor respectively that make the inverter RH and RL represent pull up and pull down strengths respectively.

While for purposes of illustration, in the present example, only 4 inverters with increasing widths and respective drive strengths (RH/RL) are shown in Table 3, one skilled in the art will appreciate that Table 3 can include RH/RL values for other PMOS/NMOS widths also. Typically, the PMOS widths are linearly related to the RH values and the NMOS widths are linearly related to the RL values. While for purposes of illustration, in the present example, inverters are shown as driving devices, one skilled in the art will appreciate that any driving device (e.g., buffers or the like) can be used for simulation purposes to provide similar driving strength. Using the information provided in the timing model and DSPF, a model of the circuit shown in FIG. 1 can be generated and simulated to determine the current strength and electromigration risks for global nets.

Figure 1B:
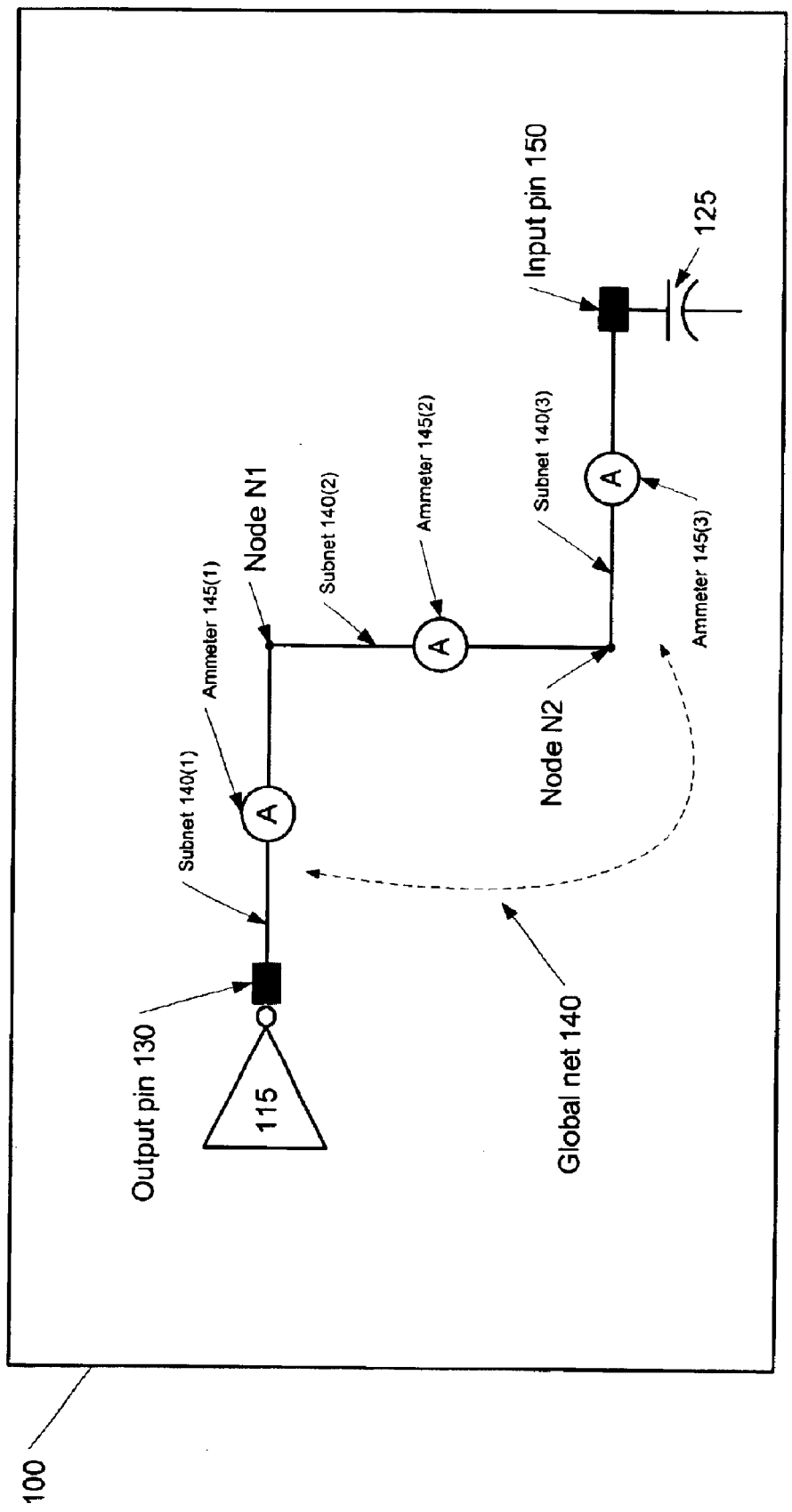
FIG. 1B illustrates an example of equivalent model for determining current strengths and electromigration risks for global nets in an integrated circuit 100 using inverter strength mapping according to an embodiment of the present invention.

FIG. 1B illustrates an example of an equivalent model for determining current strengths and electromigration risks for global nets in an integrated circuit 100 using inverter strength mapping according to an embodiment of the present invention. Using inverter drive strength mapping, a model can be generated using simulation tools (e.g. SPICE or the like). In the given model, block 110 is replaced with a substantially equivalent inverter 115. The timing model for output pin 130 driving global net 140 and corresponding to block 110 is generated using timing simulation tools (e.g., SPICE or the like) and the RH/RL values are determined using the inverter strength mapping. Depending on the RH/RL information of output pin 130, the inverter drive strength mapping file can then be used to calculate the widths of an equivalent inverter that would provide the same drive strength as that of output pin 130. For example, Table 1 shows that output pin 130 has RH=150 and RL=133. Based on Table 2 an equivalent inverter can have a PMOS width of 32.6$\mu$ and an NMOS width of 16.3$\mu$ Once the value of equivalent inverter 115 for block 110 is determined, inverter 115 can be used to substitute block 110 in the circuit for simulation. The timing model of the input pin 150 can be generated using the timing analysis tools (e.g., SPICE or the like) to obtain the input capacitance at input pin 150. In the given circuit, inverter 115 can be selected to have similar drive strength as that of block 110. Inverter 115 drives output pin 130. Further, the DSPF description of global net 140 can be modified to insert ammeters (e.g., using the simulation tools or the like) in each subnet to measure the current through each subnet.

The ammeters provide current flow information regarding each subnet. The number of ammeters in the models depends on the number of nodes in the DSPF. The number of ammeters can be reduced depending on the degree of required accuracy. Similarly, using the timing model of input pin 150, block 120 can be replaced with a capacitor 125 representing the input capacitance of block 120 at pin 150.

The simplified model of FIG. 1B can be simulated using any simulation tool (e.g., SPICE or the like) to determine the current strength of global net 140. For example, maximum drive capacity of inverter 115 can be simulated to determine the current strength on global net 140 and the ammeters can indicate the current strength in the each of the subnets. Using the manufacturer's specification of the global net characteristics (e.g., metal type, physical characteristics or the like) it can be determined whether the maximum current driven by driver 115 (or block 110 at pin 130) exceeds the capacity of global net 140 which can cause electromigration erosion on global net 140.

The simulation can be done regardless of shorts in power or ground nets because the drive strength and input capacitance of each pin is simulated using inverters and capacitors respectively. Thus, the actual functioning of the circuit is not needed. Because the actual functioning and the final layout are not needed, the electromigration risks can be determined early in the design cycle, for example, immediately after the global routing is determined. The global routes susceptible to electromigration can be adjusted (e.g., by changing the drives of various blocks, widening the global nets or the like) before the final layout. Thus, electromigration analysis can be completed (and circuits adjusted) before even the final layout is available. Further, because each global net is simulated using the actual current drives of each block, the electromigration risks can be accurately determined for each global net.

Figure 2:
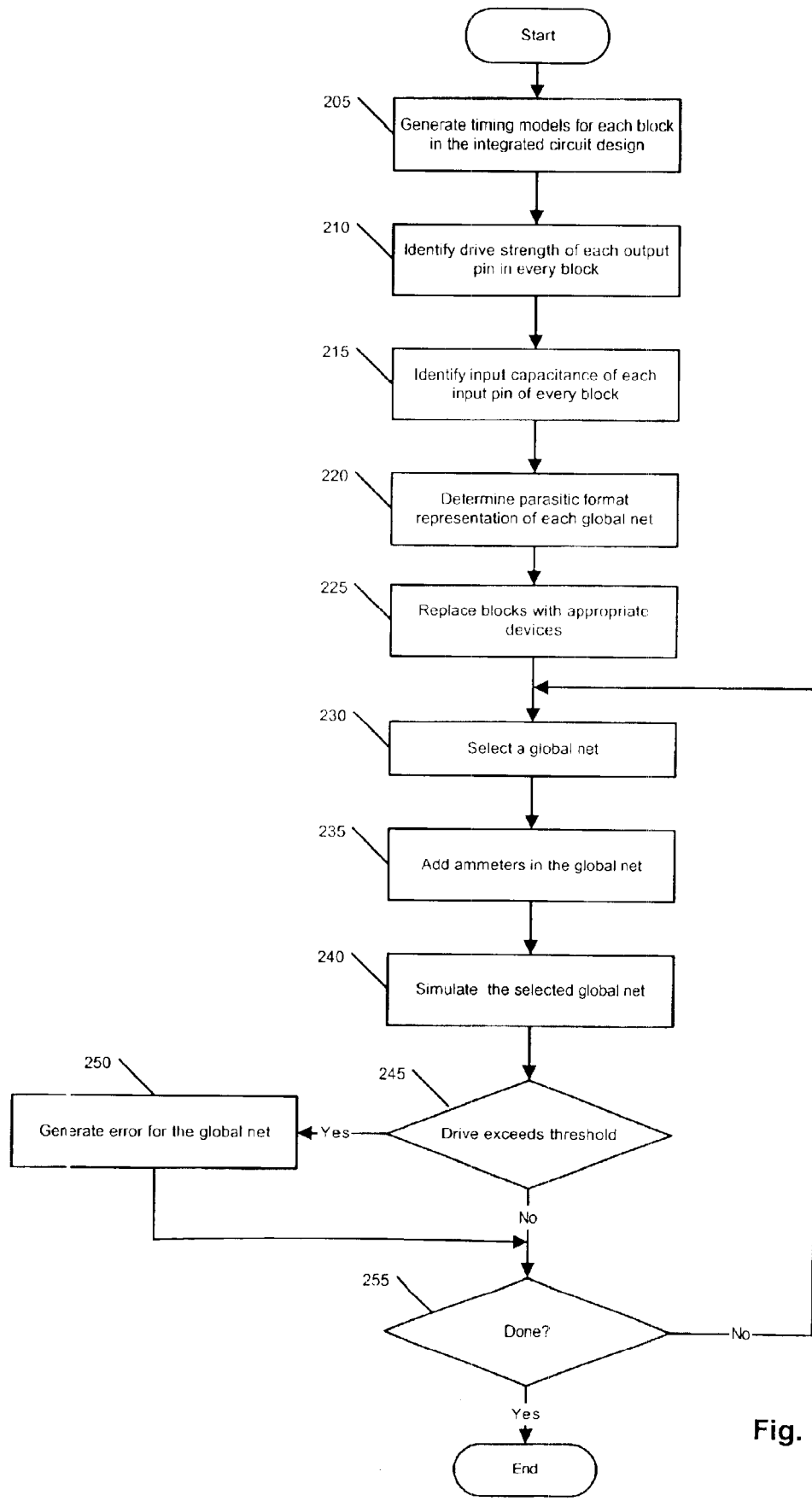
FIG. 2 is a flow diagram illustrating an exemplary sequence of operations performed during a process of determining electromigration risks for global nets according to an embodiment of the present invention.

FIG. 2 is a flow diagram illustrating an exemplary sequence of operations performed during a process of determining electromigration risks for global nets according to an embodiment of the present invention. While the operations are described in a particular order, the operations described herein can be performed in other sequential orders (or in parallel) as long as dependencies between operations allow. In general, a particular sequence of operations is a matter of design choice and a variety of sequences can be appreciated by persons of skill in art based on the description herein.

Initially, process generates timing models for every block in the integrated circuit (205). The timing models can be generated using various simulation tools known in the art (e.g., SPICE, PEARL or the like). The process identifies the drive strength of each output pin in every block using the timing model (210). The process identifies the capacitance of every input pin for every block using the timing model (215). The process determines parasitic format representation of each global net in the integrated circuit (220). The DSPF information can be determined using layout extraction tools known in the art (e.g., Simplex or the like). The process replaces each block with appropriate devices (e.g., inverters, capacitors and the like) (225). For example, each output pin in the blocks can be substituted by a driving device (e.g., inverter, buffer or the like) and each input pin in each block can be substituted by respective input capacitances.

The process selects a global net for analysis (230). The process inserts ammeters in the global net to measure the current (235). The ammeters can be inserted using software programs or scripts as identified by the simulation tools known in the art (e.g., Simplex or the like). The process simulates the selected global net using appropriate drive and input capacitance (240). The selected global net can be simulated using any simulation tool known in the art (e.g., SPICE or the like). The process determines whether the current drive from the output pin on the selected global net exceeds recommended threshold (245). The recommended thresholds are the limits determined by the manufacturer of the integrated circuit. These limits can be based on various different factors (e.g., metal used, physical characteristics of the metal, operational environment and the like).

If the current drive on the selected global net exceeds the recommended threshold, the process generates an error (250). The error can identify the selected global net and appropriate measurements (e.g., current strength or the like) for the global net. If the current drive on the selected global net does not exceed the recommended threshold, the process determines whether all the global nets have been analyzed (255). If all the global nets have not been analyzed, the process proceeds to select the next global net as determined by the user (230).

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

While particular embodiments of the present invention have been shown and described, it will be clear to those skilled in the art that, based upon the teachings herein, various modifications, alternative constructions, and equivalents may be used without departing from the invention claimed herein. Consequently, the appended claims encompass within their scope all such changes, modifications, etc. as are within the spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method for use in a design of an integrated circuit, the method comprising:
    prior to preparation of a layout of the integrated circuit design, determining detailed parasitic formats of nets in the integrated circuit design;
    substituting, in the integrated circuit design, interface elements coupled at ends of the nets with corresponding driving devices having substantially similar characteristics as the interface elements;
    performing electromigration analysis on the nets;
    wherein the interface elements represent one or more of an output interface and input interface of respective circuit blocks that include the interface elements in the integrated circuit design;
    wherein determining the detailed parasitic formats of the nets comprises:
        generating a timing model for each one of the circuit blocks in the integrated circuit;
        determining current drive of output interfaces of each circuit block; and
    determining input capacitance of input interfaces of each circuit block.

2. The method of claim 1, wherein the detailed parasitic format represents physical characteristics of the nets.

3. The method of claim 2, wherein the physical characteristics include one or more of a resistance, a capacitance, impedance and a metal type.

4. The method of claim 1, wherein the characteristics of the interface elements include one or more of current drive and input capacitance.

5. The method of claim 1, wherein the driving devices include one or more of an inverter and a buffer.

6. The method of claim 1, wherein the nets are global signal nets.

7. The method of claim 1, wherein one or more nets include one or more subnets.

8. The method of claim 1, wherein performing the electromigration analysis comprises:
    simulating current flow on the nets using current drive of the driving devices coupled at the ends of respective nets; and
    determining whether the current on the nets exceeds respective predetermined current limits for each net.

9. The method of claim 1, wherein the electromigration analysis is performed on subnets of the nets.

10. A method of processing one or more design files for a semiconductor integrated circuit, the design files encoding representations of a plurality of circuit blocks and signal nets coupling the circuit blocks, the method comprising:
    prior to preparation of a layout of the integrated circuit design, determining detailed parasitic formats of signal nets in the integrated circuit design;
    substituting, in the integrated circuit design, interface elements coupled at ends of the signal nets with corresponding driving devices having substantially similar characteristics as the interface elements;
    performing electromigration analysis on the signal nets;
    wherein the interface elements represent one or more of an output interface and input interface of respective circuit blocks that include the interface elements in the integrated circuit design; and
    wherein determining the detailed parasitic format of the signal nets comprises:
        generating a timing model for each one of the circuit blocks in the integrated circuit;
        determining current drive of the output interfaces of each circuit block; and
        determining input capacitance of the input interfaces of each circuit block.

11. The method of claim 10, wherein the detailed parasitic format represents physical characteristics of the signal nets.

12. The method of claim 11, wherein the physical characteristics include one or more of a resistance, a capacitance, impedance and a metal type.

13. The method of claim 10, wherein the characteristics of the interface elements include one or more of current drive and input capacitance.

14. The method of claim 10, wherein the driving devices include one or more of an inverter and a buffer.

15. The method of claim 10, wherein the signal nets are global signal nets.

16. The method of claim 10, wherein one or more signal nets include one or more subnets.

17. The method of claim 10, wherein performing the electromigration analysis comprises:
   simulating current flow on the signal nets using current drive of the driving devices coupled at the ends of respective signal nets; and
   determining whether the current on the signal nets exceeds respective predetermined current limits for each net.

18. The method of claim 17, wherein the electromigration analysis is performed on each one of the subnets of the signal nets.

19. A processor comprising:
   means for determining detailed parasitic formats of nets in an integrated circuit design;
   means for substituting, in the integrated circuit design, interface elements coupled at ends of the nets with corresponding driving devices having substantially similar characteristics as the interface elements;
   means for performing electromigration analysis on the nets; and
   wherein the means for determining comprises:
      means for generating a timing model for each one of a plurality of circuit blocks in the integrated circuit;
      means for determining current drive of output interfaces of each circuit block; and
      means for determining input capacitance of input interfaces of each circuit block.

20. The processor of claim 19, further comprising:
   means for simulating current flow on the nets using current drive of the driving devices coupled at the ends of respective nets; and
   means for determining whether the current on the nets exceeds respective predetermined current limits for each net.

* * * * *

UNITED STATES PATENT AND TRADEMARK OFFICE
CERTIFICATE OF CORRECTION

PATENT NO. : 6,954,914 B2 Page 1 of 1
DATED : October 11, 2005
INVENTOR(S) : Shyam Sundar et al.

It is certified that error appears in the above-identified patent and that said Letters Patent is hereby corrected as shown below:

Column 2,
Line 15, delete "nets," and replace with -- nets. --.
Line 46, delete "input, capacitance." and replace with -- input capacitance. --.

Column 3,
Line 32, delete "nets net." and replace with -- net. --.

Column 8,
Line 10, delete "format represents" and replace with -- formats represent --.
Line 48, delete "format" and replace with -- formats --.
Line 57, delete "format represents" and replace with -- formats represent --.

Signed and Sealed this

Twenty-fifth Day of April, 2006

JON W. DUDAS
*Director of the United States Patent and Trademark Office*